(12) United States Patent
Gelinck et al.

(10) Patent No.: US 11,049,944 B2
(45) Date of Patent: Jun. 29, 2021

(54) HIGH VOLTAGE THIN-FILM TRANSISTOR AND METHOD OF MANUFACTURING THE SAME

(71) Applicant: Nederlandse Organisatie voor toegepast-natuurwetenschappelijk onderzoek TNO, s-Gravenhage (NL)

(72) Inventors: Gerwin Hermanus Gelinck, Valkenswaard (NL); Jan-Laurens Pieter Jacobus Van Der Steen, Zaltbommel (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 16/650,103

(22) PCT Filed: Sep. 24, 2018

(86) PCT No.: PCT/NL2018/050630
§ 371 (c)(1),
(2) Date: Mar. 24, 2020

(87) PCT Pub. No.: WO2019/066647
PCT Pub. Date: Apr. 4, 2019

(65) Prior Publication Data
US 2020/0235213 A1    Jul. 23, 2020

(30) Foreign Application Priority Data
Sep. 26, 2017 (EP) ..................................... 17193216

(51) Int. Cl.
*H01L 29/417* (2006.01)
*H01L 29/78* (2006.01)
*H01L 29/786* (2006.01)

(52) U.S. Cl.
CPC .... *H01L 29/41733* (2013.01); *H01L 29/7835* (2013.01); *H01L 29/78624* (2013.01)

(58) Field of Classification Search
CPC ........... H01L 29/41733; H01L 29/7835; H01L 29/78624
See application file for complete search history.

(56) References Cited

U.S. PATENT DOCUMENTS 6,310,378 B1    10/2001  Letavic et al.
6,912,082 B1 *   6/2005  Lu ....................... B81C 1/00246
                                              257/E27.112
2007/0114608 A1   5/2007  Letavic \* cited by examiner

*Primary Examiner* — Edward Chin
(74) *Attorney, Agent, or Firm* — Leydig, Voit & Mayer, Ltd.

(57) ABSTRACT

A high voltage thin-film transistor is specified comprising a gate electrode (G11, G21) in a gate electrode layer (31), a semiconductive channel (C11,C12) in a channel layer (34) parallel to the gate electrode layer and being electrically insulated from the gate electrode by a gate dielectric layer (32). The transistor further comprises a dominant main electrode and a subordinate main electrode (M11, M12). The main electrodes each have an external portion (M11e, M12e) in a main electrode layer (36) and an internal portion (M11e, M12e) that protrudes through a further dielectric layer (35) between the main electrode layer and the channel layer to electrically contact the semiconductive channel in a dominant main electrode contact area (M11c) and a subordinate main electrode contact area (M12c) respectively. A first distance (D1) is defined between a side of the dominant main electrode contact area facing the subordinate main electrode contact area and a side of the external portion of the dominant main electrode facing the external portion of the subordinate main electrode. A second distance (D2) is defined between a side of the subordinate main electrode contact area facing the dominant main electrode contact area (Continued)

and a side of the external portion of the subordinate main electrode facing the external portion of the dominant main electrode, wherein the first distance is at least twice as large as the second distance.

15 Claims, 8 Drawing Sheets

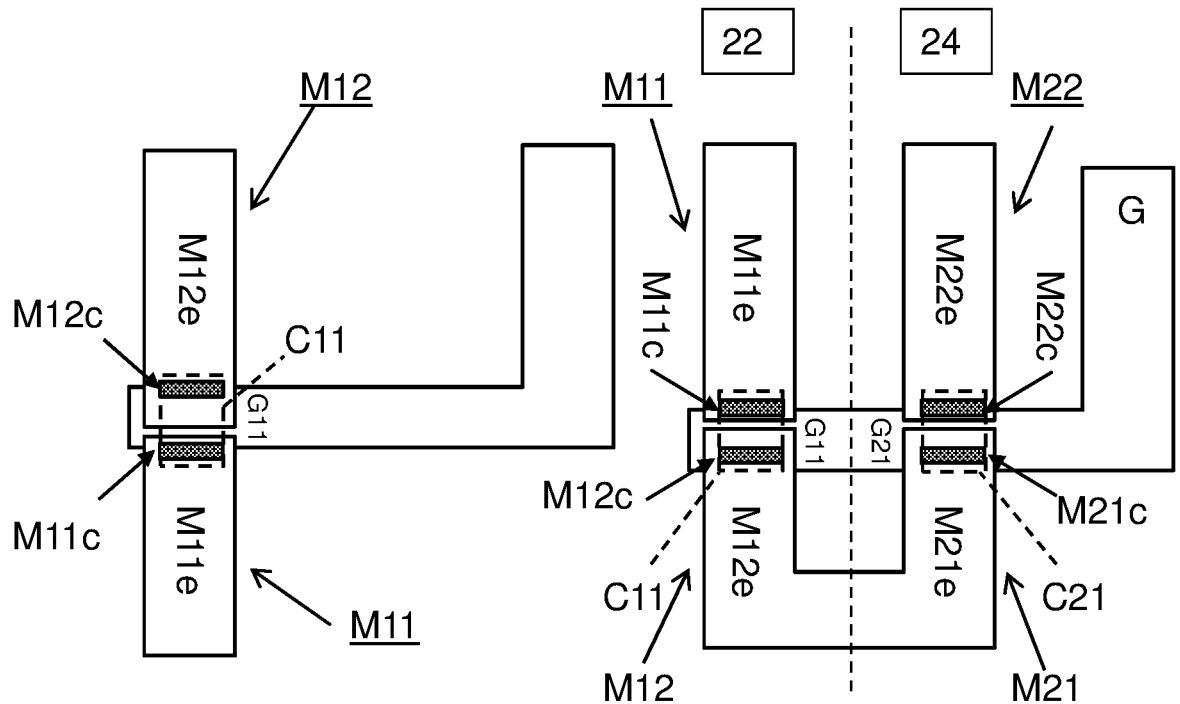
FIG. 9A
FIG. 9C
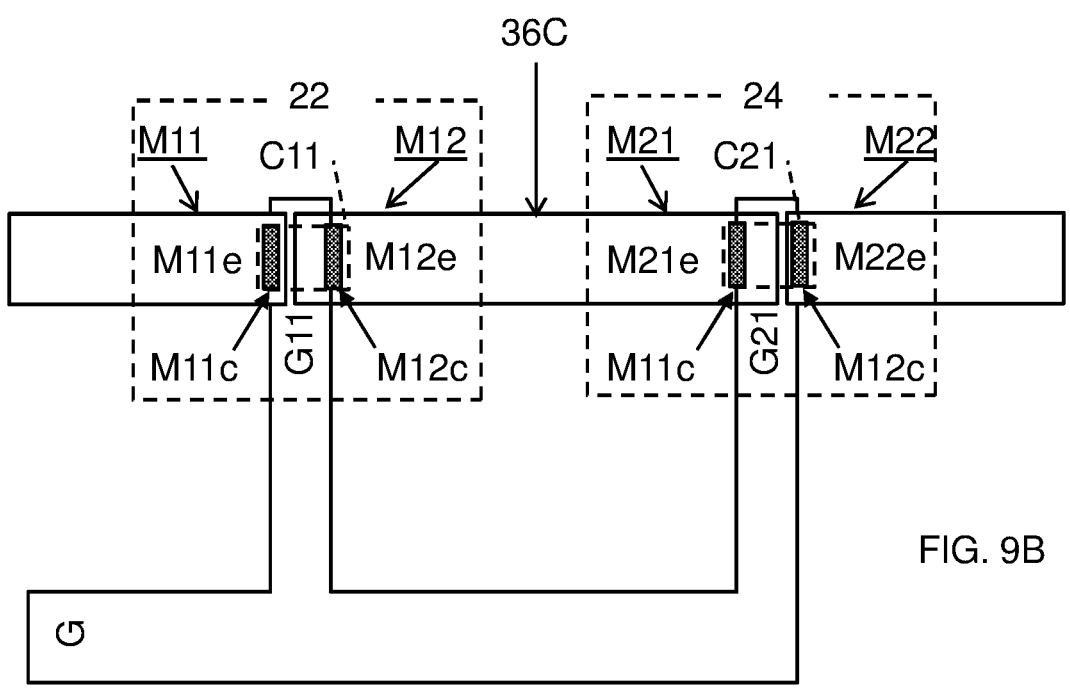
FIG. 9B

HIGH VOLTAGE THIN-FILM TRANSISTOR AND METHOD OF MANUFACTURING THE SAME

CROSS-REFERENCE TO RELATED APPLICATIONS

This patent application is a U.S. National Phase of PCT International Application No. PCT/2018/050630, filed Sep. 24, 2018, which claims priority to European Application No. 17193216.3, filed Sep. 26, 2017, which are both expressly incorporated by reference in their entireties, including any references contained therein.

BACKGROUND OF THE INVENTION

Field of the Invention

Related Art

Various applications require high voltage actuation e.g. in a range of 100-400 Vpp. Examples thereof are applications like displays and imagers using released polymer actuator membranes. Voltages in this range are well outside the operating range provided by standard thin film transistor technology. Using thick gate dielectrics would allow such high operating voltages, but thick dielectric layers are typically avoided for performance and cost reasons. Also, such layers can easily crack, particularly when mechanically strained.

Chow et al. discloses a technology for high voltage thin film transistors (HVTFT) and its integration with a MEMS to be controllably actuated therewith, in "High voltage thin film transistors integrated with MEMS. Transducers" '05: 13th International Conference on Solid-State Sensors, Actuators and Microsystems; Digest of Technical Papers; 2005 Jun. 5-9; Seoul; Korea. Piscataway N.J.: IEEE; 2005; 2:1318-1321. In the technology proposed therein, the thin film transistor is provided with an offset region near the drain contact. This offset region enables a high breakdown voltage on the drain electrode while voltages for the gate and source electrodes can be kept low.

It is a disadvantage of this known HVTFT that the drain offset adds to the total device resistance. This causes an unacceptable limitation to a device current that the HVTFT can provide to the actuator. It is an additional disadvantage that this increased device resistance entails an increased power consumption and an increased heat development.

It is noted that U.S. Pat. No. 6,310,378 discloses a high voltage thin film transistor with improved on-state characteristics and method for making same. FIG. 1 of US'378 depicts an SOI LDMOS device comprises a substrate 10, an oxide layer 20, an epitaxial film layer 30, a source electrode 60, a gate electrode 70 and a drain electrode 80. The thin film layer 30 in lateral sequence from left to right subsequently comprises a source region 31, a body region 32, a thin drift region 35 and a drain region 36. The thin drift region 35 extends for a length L, Formed above the thin film layer 30 are a gate oxide layer 41 and a drift region insulating layer 42. Fabricated above the gate oxide 41 and drift region insulating 42 layers is a polysilicon gate 50. In order to achieve a high breakdown voltage capability, the drift region 35 is thinned to less than 1 micron and a linear doping profile is introduced into the drift region. The doping profile varies from a minimum in the region 33 near to the body region 32 to a maximum in the drift region adjacent to the drain region 34. The onset of the linear doping profile in the device of FIG. 1 coincides with the thinning of the SOI layer 30 that creates the thin drift region 35, both starting at the origin indicated by reference line 5.

It is further noted that US2007114608 discloses a lateral thin-film Silicon-On-Insulator (SOI) device, a field plate is provided to extend substantially over a lateral drift region to protect the device from package and surface charge effects. In particular, the field plate comprises a layer of plural metallic regions which are isolated laterally from one another by spacing so as to assume a lateral electric field profile which is established by a volume doping gradient in the silicon drift region. The field plate is connected to, or is an extension of the source region.

It is still further noted that U.S. Pat. No. 6,912,082 discloses integrated driver electronics for a MEMS device using high voltage thin film transistors

SUMMARY OF THE INVENTION

It is an object of the invention to provide a high voltage thin film transistor wherein these disadvantages are at least mitigated.

In accordance with this object, the high voltage thin-film transistor comprises:
- a gate electrode in a gate electrode layer,
- a semiconductive channel in a channel layer parallel to said gate electrode layer and being electrically insulated from said gate electrode by a gate dielectric layer, wherein the semiconductive channel layer has a first surface facing the gate electrode layer, and a second surface opposite the first surface,
- a dominant main electrode and a sub-ordinate main electrode, each having an external portion in a main electrode layer and an internal portion that protrudes through a further dielectric layer between the main electrode layer and the channel layer to electrically contact the semiconductive channel in a dominant main electrode contact area and a subordinate main electrode contact area respectively, wherein a first distance is defined between a side of the dominant main electrode contact area facing the subordinate main electrode contact area and a side of the external portion of the dominant main electrode facing the external portion of the subordinate main electrode, and a second distance is defined between a side of the subordinate main electrode contact area facing the dominant main electrode contact area and a side of the external portion of the subordinate main electrode facing the external portion of the dominant main electrode, wherein the first distance is at least twice as large as the second distance. The high voltage thin-film transistor is characterized in that the second surface of the semiconductive channel layer faces the main electrode layer In case the claimed thin film transistor is operated in a mode wherein the polarity of the dominant main electrode with respect to the other main electrode corresponds to the polarity of the charge carriers that are responsible for the conduction of the semiconductive channel, the dominant main electrode is configured as a source electrode. For example this is the case if the charge carriers of the semiconductive channel are electrons and the dominant main electrode has a negative polarity with respect to the subordinate main electrode. Alternatively, this is the case if the charge carriers of the semiconductive channel are holes and the dominant main electrode has a positive polarity with respect to the subordinate main electrode. In this configuration, also denoted as dominant source configuration, large part of the channel of the transistor is controlled by the potential of the dominant source electrode, which is for example a reference voltage of 0 V. The dominance of the source electrode in this configuration results in good control over charge injected into the channel, high immunity against short channel effects and high output resistance.

Conversely, in case the claimed thin film transistor is operated in a mode wherein the polarity of the dominant main electrode with respect to the subordinate main electrode is opposite to a polarity of the charge carriers that are responsible for the conduction of the semiconductive channel, the dominant main electrode is configured as a drain electrode. For example this is the case if the charge carriers of the semiconductive channel are electrons and the dominant main electrode has a positive polarity with respect to the subordinate main electrode, or if the charge carriers of the semiconductive channel are holes and the dominant main electrode has a negative polarity with respect to the subordinate main electrode. In this configuration, also denoted as dominant drain configuration, large part of the channel is electrostatically influenced by the drain voltage. The extension at the drain side helps accumulate charge in the channel, thus results in higher current compared to the first configuration. Since the field from the drain side is extending further into the channel, also under the gate, the transistor exhibits a strong VDS (drain-source voltage) dependence, hence a lower output resistance compared to the dominant source configuration.

BRIEF DESCRIPTION OF THE DRAWINGS

These and other aspects are described in more detail with reference to the drawing. Therein:

FIG. 9A shows an exemplary spatial configuration of a high voltage thin film transistor;

FIG. 9B, 9C shows exemplary spatial configurations of a serial arrangement of two high voltage thin film transistors.

DETAILED DESCRIPTION OF EMBODIMENTS

Like reference symbols in the various drawings indicate like elements unless otherwise indicated.

Figure 1:
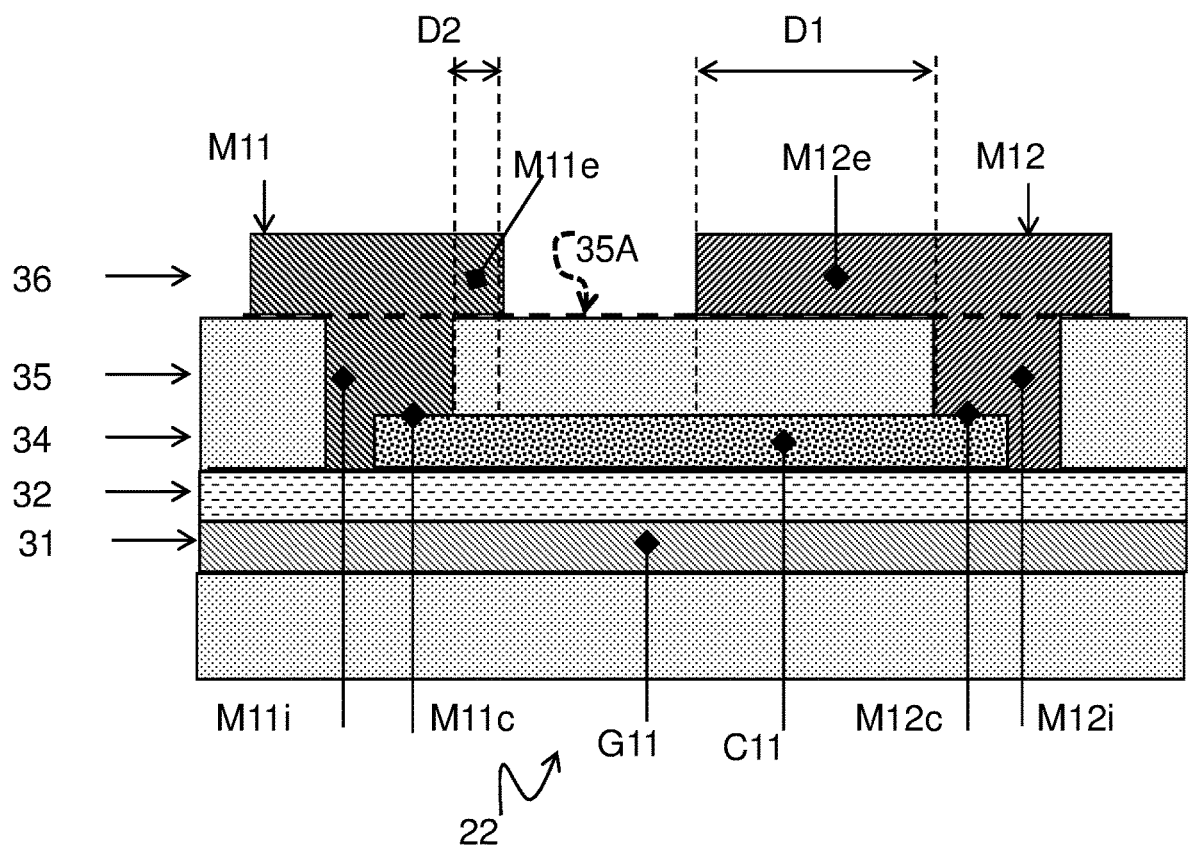
FIG. 1 is a cross-section that schematically shows and embodiment of a high voltage thin-film transistor.

FIG. 1 schematically shows a high voltage thin-film transistor 22 that comprises a gate electrode G11 in a gate electrode layer 31, a semiconductive channel C11 in a channel layer 34 parallel to the gate electrode layer and being electrically insulated from the gate electrode by a gate dielectric in a dielectric layer 32. The high voltage thin-film transistor 22 further comprises a dominant main electrode M12 and a subordinate main electrode M11.

The dominant main electrode M12 and the sub-ordinate main electrode M11, each have an external portion and an internal portion. The external portion, denoted as M12e, M11e respectively, is provided in a main electrode layer 36 on a surface 35A of a further dielectric layer 35 provided between the main electrode layer and the channel layer. The internal portion, M12i, M11i respectively protrudes through the further dielectric layer 35 to electrically contact the semiconductive channel C11 in a dominant main electrode contact area M12c and a subordinate main electrode contact area M11c respectively.

A first distance D1 is defined between a side of the dominant main electrode contact area M12c facing the subordinate main electrode contact area M11c and a side of the external portion M12e of the dominant main electrode M12 facing the external portion M11e of the subordinate main electrode M11. A second distance D2 is defined between a side of the subordinate main electrode contact area M11c facing the dominant main electrode contact area M12c and a side of the external portion M11e of the subordinate main electrode M11 facing the external portion M12e of the dominant main electrode M12. The first distance D1 is at least twice as large as the second distance D2.

Figure 2:
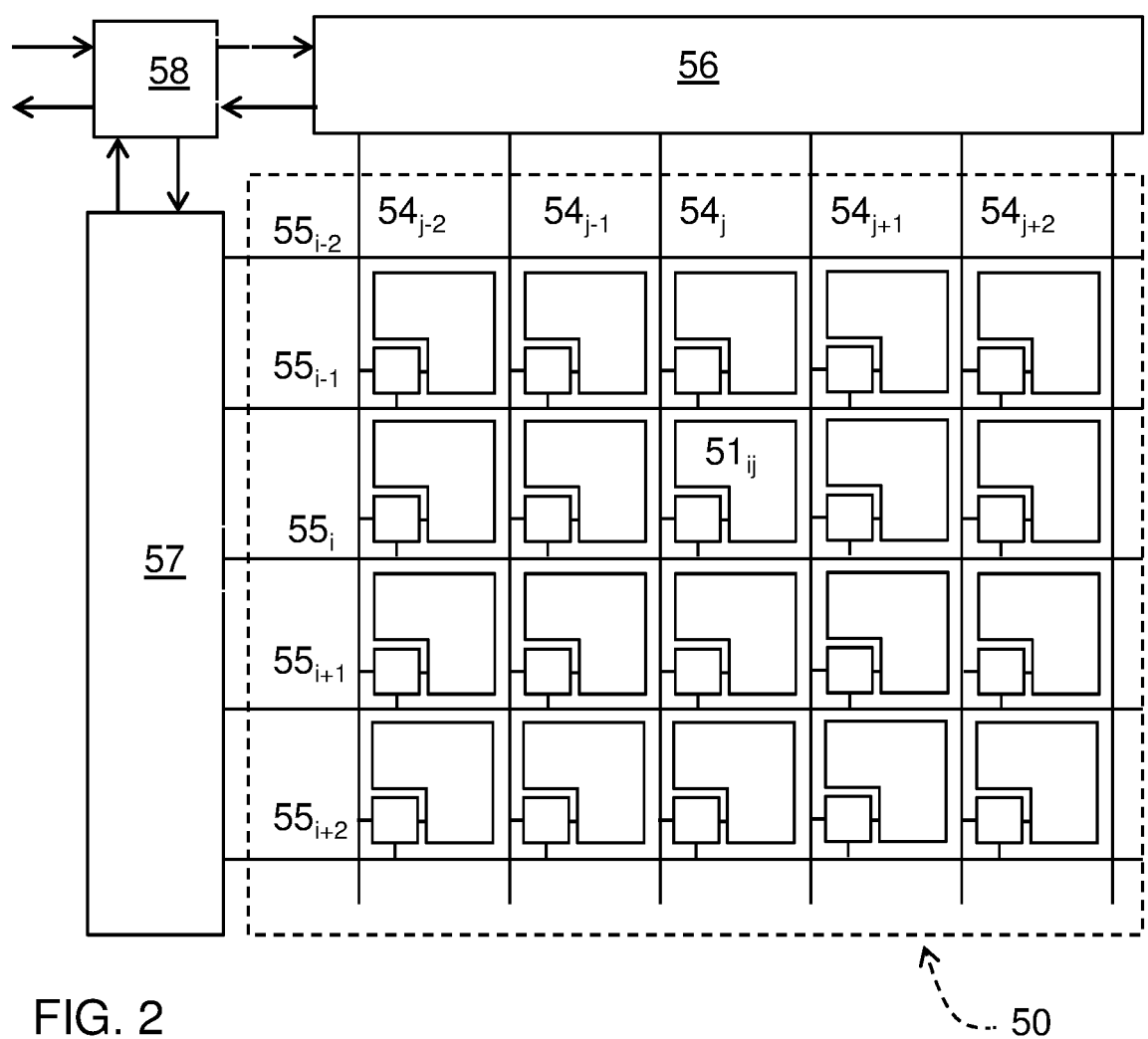
FIG. 2 schematically shows a matrix of actuator elements.

FIG. 2 shows an application 50 comprising a plurality of actuator elements 51$ij$ arranged in a matrix with rows and columns. By way of example only 5 rows and 5 columns are shown, but in practice the number of rows and columns can be substantially larger, for example in the order of hundreds or thousands. Alternatively, embodiments may be contemplated having a smaller number of rows and/or columns. A column driver 56 is provided that supplies a respective supply voltage to column lines $4_{j-2}$, $4_{j-1}$, $4_j$, $4_{j+1}$, $4_{j+2}$. Furthermore a row driver 57 is provided that provides a respective control voltage to row lines $5_{i-2}$, $5_{i-1}$, $5_i$, $5_{i+1}$, $5_{i+2}$. The column driver 56 and the row driver 57 on their turn are controlled by main controller 58.

Figure 3:
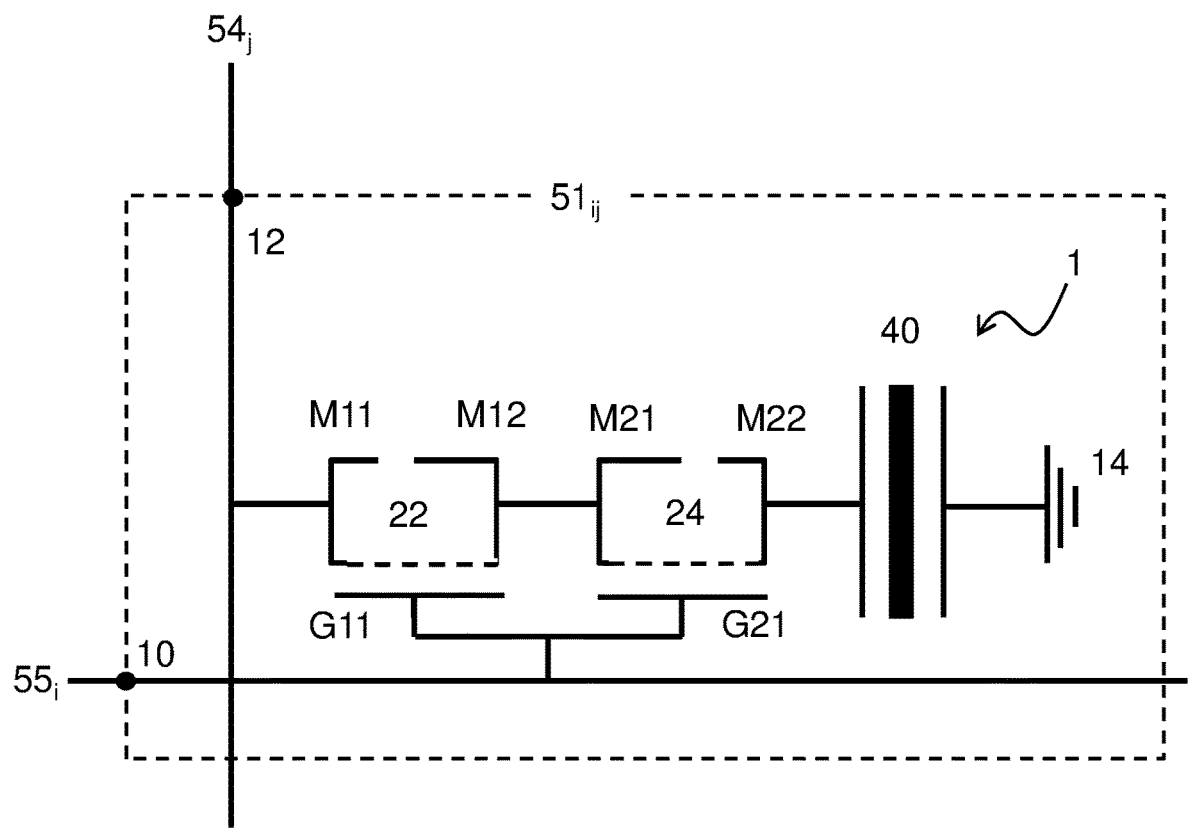
FIG. 3 shows a high voltage driver circuit suitable for use in an actuator element in the matrix of FIG. 2.

FIG. 3 shows a high voltage driver circuit 1 used in the actuator elements in more detail. The high voltage driver circuit 1 in FIG. 3 is for example part of actuator element 51$ij$ connected to column line $54_j$ and row line $55_i$. Typically this driver circuit is also representative for the driver circuits in the other actuator elements although this is not strictly necessary. Some actuator elements may for example have an additional functionality. As shown in FIG. 3, the high voltage driver circuit 1 comprises a control terminal 10 connected to row line $55_i$, a first power supply terminal 12 coupled to column line $54_j$ and a second power supply terminal 14. The second power supply terminal 14 is typically a common terminal for each of the actuator elements, for example the second power supply terminal 14 may be coupled to an electrically conductive layer which is maintained at a reference voltage of 0V. Alternatively the second power supply terminal may be coupled to a further grid of lines. FIG. 3 shows that the high voltage driver circuit 1 includes a serial arrangement extending from the first power supply terminal 12 to the second power supply terminal 14. The serial arrangement includes a first high voltage thin-film transistor 22 as shown in FIG. 1 and a second thin-film transistor 24. The high voltage driver circuit 1 further includes a load, here a capacitive load, in particular a polymer actuator membrane 40, that is controllably powered by the serial arrangement of the first high voltage thin-film transistor 22 and the second thin-film transistor 24 having a gate G11, G21 controlled by the control terminal 10.

As shown in FIG. 3, also the second thin-film transistor 24 is a high voltage thin-film transistor. In this example the first thin film transistor 22 has a subordinate main electrode M11 and a dominant main electrode M12, as shown for example in FIG. 1. The second thin-film transistor 24 has a dominant main electrode M21 and a subordinate main electrode M22. Both the first and the second high voltage thin-film transistors 22, 24 are coupled with their gate G11, G21 to the control terminal 10. The load 40 is arranged in series with the serial arrangement, between the second high voltage thin-film transistor 24 and the second power supply terminal 14. I.e. at one side it is connected to the subordinate main electrode M22 of the second high voltage thin-film transistor 24, and at the other side it is connected to the second power supply terminal 14. As shown in FIG. 3, the first high voltage thin-film transistor 22 comprises as its dominant main electrode M12 the main electrode last appearing in the serial arrangement. The second thin-film transistors 24 comprises as its dominant main electrode M21 the main electrode first appearing in the serial arrangement. I.e. the first and the second thin-film transistors 22, 24 are serially arranged in that their dominant main electrodes M12, M21 are electrically connected.

Figure 4A:
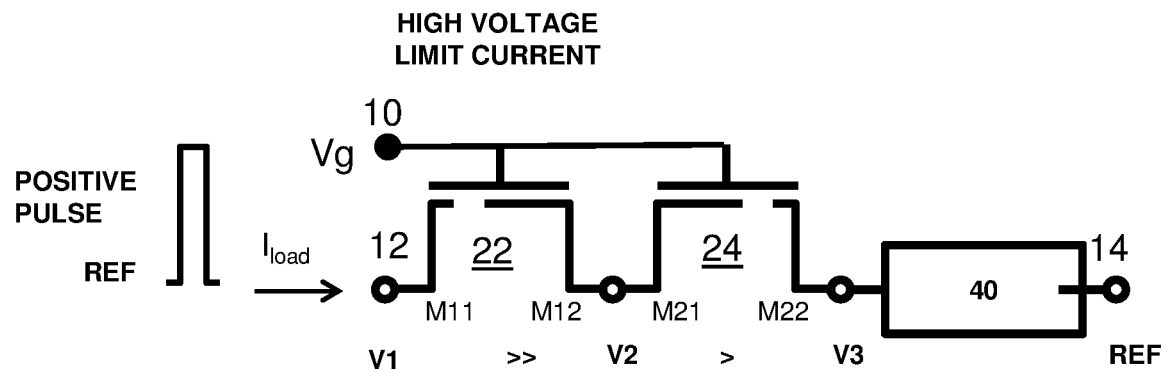
FIG. 4A, 4B respectively shows a first and a second state high voltage driver circuit of FIG. 3.
Figure 4B:
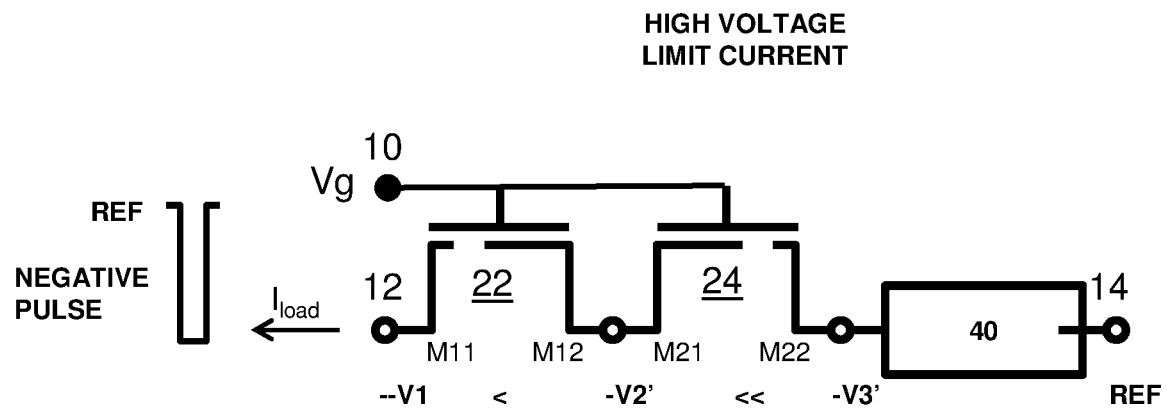

FIG. 4A, 4B shows a first and a second state of the serial arrangement 22, 24, 40 during operation. Therein FIG. 4A shows a first half phase, wherein a positive voltage V1 with respect to the reference voltage as the second power supply terminal 14 is applied to the first power supply terminal 12, and FIG. 4B shows a second half phase, wherein a negative voltage −V1 is applied to the first power supply terminal 12.

Figure 5:
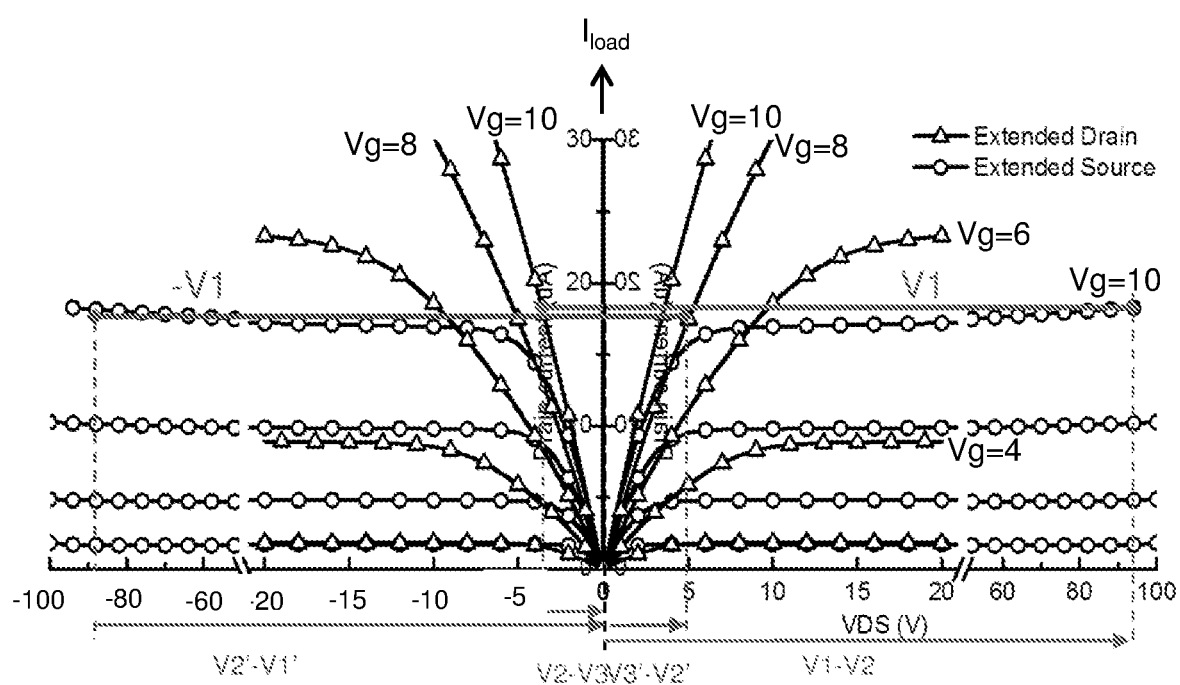
FIG. 5 shows a relationship between operation voltages occurring in the high voltage driver circuit of FIG. 3 and a load current provided to a load.

In the first half phase as illustrated in FIG. 4A the main electrodes M12 and M22 operate as a source of electrons as the charge carriers. Main electrodes M11, M21 operate as drains in this first half phase. Hence, in this half phase, transistor 22 has an dominant source configuration and transistor 24 has an dominant drain configuration. In this half phase large part of the channel of transistor 22 is controlled by the potential of the dominant main electrode M12. The dominance of the source electrode here M12, due to its extended overlap in this embodiment, results in good control over charge injected into the transistor channel, high immunity against short channel effects and high output resistance. For the second transistor 24, large part of the channel is electrostatically influenced by the drain voltage V2. The extension at the drain side helps accumulate charge in the channel, thus results in higher current compared to the first configuration. Since the field from the drain side is extending further into the channel, also under the gate, the transistor 24 exhibits a strong VDS (drain-source voltage) dependence, hence a lower output resistance compared to the first configuration 22. Accordingly, in this first half phase, as shown in FIG. 4A, the voltage difference V1-V2 is substantially higher than the difference V2-V3. This is illustrated in FIG. 5. At a gate voltage Vg equal to 10 V, the load current Load through the first transistor 22 is restricted to about 18 uA even at a high drain source voltage. As a result at a supply voltage of about 100V at the power supply terminal 12, the voltage drop V1-V2 assumes a value of about 95V and the voltage drop V2-V3 remains in the order of a few V. Once the capacity formed by the actuator 40 is charged, the total voltage drop V1-V3 reduces, in particular the voltage drop V1-V2 over the first high voltage thin film transistor reduces while maintaining substantially the same load current Load. Only in a final stage of the first half phase, when the total voltage drop V1-V3 decreases below about 10 V, the load current starts to decrease significantly. Therewith, in this first half phase, the first transistor 22 serves to protect the second transistor 24 by limiting the current to an acceptable level, while substantially maintaining that level until the actuator 40 is almost fully charged. This could not be achieved in case the first transistor 22 is replaced by a resistor. Such resistor could provide protection but would substantially increase the RC time of the circuitry, as the load current $I_{load}$ would linearly decreases with the decrease of the voltage difference In the second half phase as illustrated in FIG. 4B the main electrodes M11 and M21 operate as a source of electrons as the charge carriers. The main electrodes M12, M22 are the drains in this second half phase. Hence, in this phase of operation, transistor 24 has a dominant source configuration and transistor 22 has an dominant drain configuration. In this phase of operation large part of the channel of transistor 24 is controlled by the potential of dominant source electrode M21. Therewith the dominance of the source electrode M21, here resulting from its extended overlap, results in good control over charge injected into the channel, high immunity against short channel effects and high output resistance. For the first transistor 22, now large part of the channel is electrostatically influenced by the drain voltage −V2'. The extension at the drain side helps accumulate charge in the channel, thus results in higher current compared to the first configuration. Since the field from the drain side is extending further into the channel, also under the gate, the transistor 22 now exhibits a strong VDS (drain-source voltage) dependence, hence a lower output resistance compared to the first configuration 24. Accordingly, in this phase, as shown in FIG. 4B, and further illustrated in FIG. 5, the voltage difference V2'-V3' is substantially higher than the difference V1'-V2'. As in the first half phase, a relatively constant load current $I_{load}$ (of opposite polarity as compared to the first half phase) is achieved. In summary, in this second half phase the second high voltage thin film transistor 24 provides for a protection of the first high voltage thin film transistor 22, while allowing for a relatively high, constant load current.

Accordingly, in the first half-phase the first transistor 22 is capable of high voltage operation and therewith protects the second transistor 24 that operates in the first half phase as a normal transistor. In the second half-phase the second transistor 24 shows the required high voltage operation and therewith protects the first transistor 22, now acting as normal transistor. Hence, while the individual TFTs are asymmetric, the overall cell operation is symmetric but retains the high-voltage property of the individual TFTs.

Figure 6:
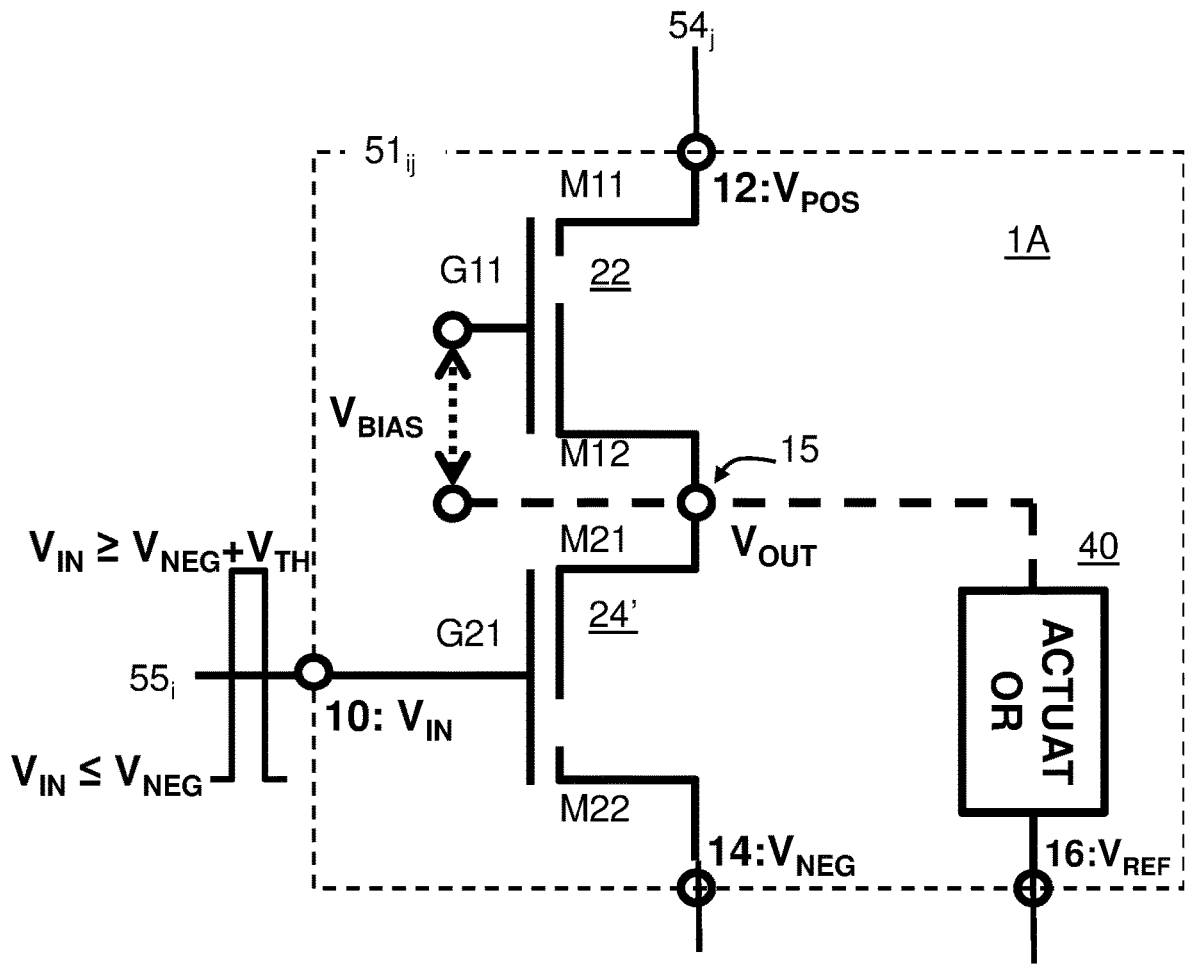
FIG. 6 shows an alternative a high voltage driver circuit suitable for use in an actuator element of the matrix of FIG. 2.

FIG. 6 shows an alternative high voltage driver circuit 1A. As circuit 1, it comprises a control terminal 10, a first power supply terminal 12 and a second power supply terminal 14. Additionally it comprises a third power supply terminal 16, which is maintained at a reference level of 0V for example. Typically the third power supply terminal 16 may be coupled to an electrically conductive layer which is maintained at a reference voltage of 0V. Alternatively the third power supply terminal may be coupled to a further grid of lines. As in the embodiment of the circuit 1, the circuit 1A comprises a serial arrangement extending from the first power supply terminal 12 to the second power supply terminal 14 that includes a first and a second thin-film transistor 22, 24. The control terminal 10 of the high voltage driver circuit 1A may be connected to row line $55_i$, the first power supply terminal 12 coupled to column line $54_j$ and the second power supply terminal 14 may be coupled to a grid of lines providing a constant negative voltage $V_{NEG}$ with respect to the reference voltage at the third power supply terminal 14. In this case, the thin-film transistors 22, 24 both are high voltage thin-film transistors as shown in FIG. 1. Alternatively the second thin film transistor 24 may be of a conventional type, i.e. without a dominant main electrode.

Contrary to the circuit 1, only the second thin-film transistor 24 has its gate controlled by the control terminal 10, and the first high voltage thin-film transistor 22 has its gate set to a fixed bias voltage $V_{BIAS}$ (e.g. 0V) with respect to its dominant main electrode M12. In this embodiment the load 40 is coupled between an intermediary node 15 in the serial arrangement formed by the first and the second transistor 22, 24, and the third power supply terminal 16. In this embodiment the potential at the subordinate main electrode M11 of the first transistor 22 is greater than or equal to the potential at its dominant main electrode M12. Presuming that the first high voltage thin film transistor 22 is a negative charge carrier type, the dominant main electrode M12 forms its source. Therewith the channel of this first transistor 22 is controlled by the potential of its dominant electrode M12 therewith achieving a good control over charge injected into the transistor channel, high immunity against short channel effects and high output resistance.

In a first half phase of operation, a voltage $V_{IN}$ is applied to the control terminal 10 having a value less than or equal to $V_{NEG}$. Therewith the second transistor 24' is set into a non-conductive state, and the load 40 is charged with a load current provided by the first transistor 22. As this transistor 22 has a dominant source configuration, it provides for a current limitation, and therewith protects the second transistor, which is in particular important at the moment of switching the second transistor into its non-conducting state. The current is maintained at substantially the same level until the potential $V_{OUT}$ at intermediate node 15 has substantially approximated the voltage $V_{POS}$ at the first power supply terminal 12. Therewith the first transistor configured in a dominant source configuration, allows for a rapid charging of the load.

In the second half phase of operation, a voltage $V_{IN}$ having a value greater than the voltage $V_{NEG}$ plus the required threshold voltage $V_{TH}$ of the second transistor 24' is applied to the control terminal 10. Therewith the second transistor 24' is set into a conductive state, allowing the load 40 to discharge until the output voltage $V_{OUT}$ at intermediate node approaches $V_{NEG}$ at the second power supply terminal 14.

Again referring to FIG. 1, a high voltage thin-film transistor 22 as shown therein may be manufactured as follows. A substrate 30, for example of a glass or of a polymer is provided with a gate electrode layer 31 of an electrically conductive material, e.g. a metal, defining a gate electrode G11. A dielectric layer 32 of a dielectric material, for example of a ceramic material is provided upon the gate electrode layer that defines a gate dielectric for the gate electrode. Then a channel layer 34 of a semiconductive material is provided, defining a semiconductive channel C11. A further dielectric layer 35 of a dielectric material is provided on the channel layer. Then a main electrode layer 36 of an electrically conductive material is provided that comprises an external portion M11e of the dominant main electrode M11 and an external portion M12e of the subordinate main electrode. The external portions of the dominant main electrode and of the subordinate main electrode are mutually distinct An internal portion M11i of the dominant main electrode M11 is provided that protrudes through the further dielectric layer 35 to electrically contact the semiconductive channel in a dominant main electrode contact area M11c.

An internal portion M12i of the subordinate main electrode M12 is provided that protrudes through the further dielectric layer 35 to electrically contact the semiconductive channel in a subordinate main electrode contact area M12c.

To provide for an electric contact with the channel C11, the electrically conductive material of the main electrode layer is allowed to penetrate the further dielectric layer 35. This may be achieved in that openings are provided in the further dielectric layer 35, e.g. during the deposition process used for the further dielectric layer, e.g. using a printing method, or later in a separate process step. Alternatively the internal portions M11e, M12e of the main electrodes M11, M12 that electrically contact the channel C11 may be formed by separate conductive elements that extend between the channel layer 34 and the main electrode layer 36. As shown in FIG. 1, a first distance D1 is defined between a side of the dominant main electrode contact area M11c facing the subordinate main electrode contact area M12c and a side of the external portion M11e of the dominant main electrode M11 facing the external portion M12e of the subordinate main electrode M12. A second distance D2 is defined between a side of the subordinate main electrode contact area M12c facing the dominant main electrode contact area M11c and a side of the external portion M12e of the subordinate main electrode M12 facing the external portion Mile of the dominant main electrode M11. The first distance D1 is at least twice as large as the second distance D2.

Figure 7:
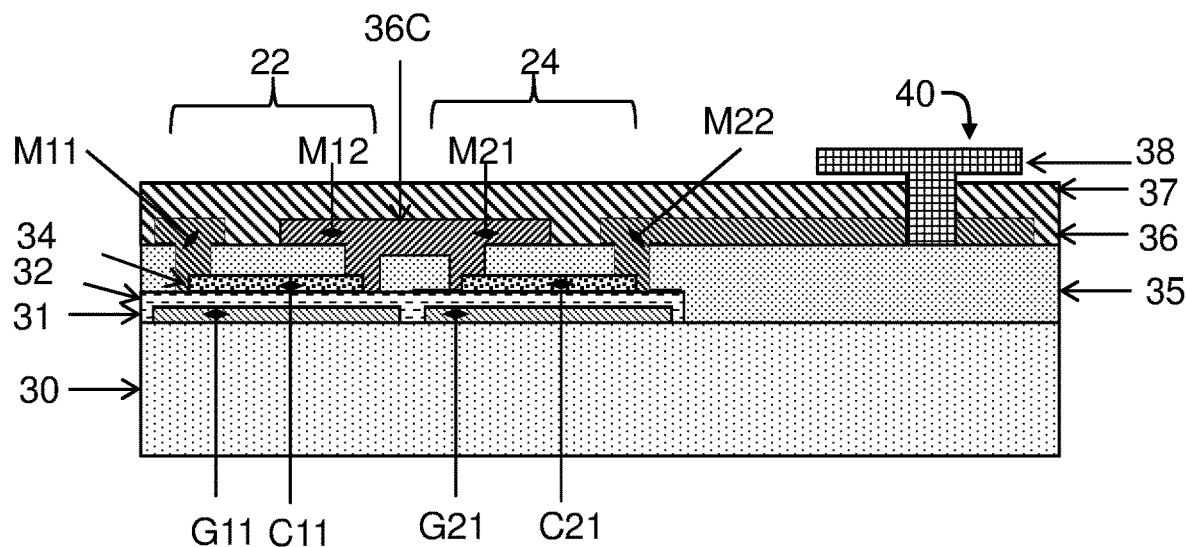
FIG. 7 is a cross-section that schematically shows an implementation of the circuit of FIG. 3.

FIG. 7 illustrates how the high voltage thin-film transistors 22, 24 can be integrated with a load 40 to be supplied into a product. This may be achieved as follows. As shown in FIG. 7, the gate electrode layer 31 additionally defines a further gate electrode G21 and the dielectric layer 32 additionally defines a gate dielectric for the further gate electrode G21. Likewise, the channel layer 33 additionally defines a further a further semiconductive channel C21.

In the same manner as described for the first thin-film transistor a further dominant main electrode M21 and a further subordinate main electrode M22 can be provided. As shown in FIG. 7, the external portions of the dominant main electrode M12 of the first thin-film transistor 22 and of the further dominant main electrode M21 are formed by a common region in the main electrode layer 36. FIG. 7 shows that an insulating layer 37 of an electrically insulating material is provided.

Furthermore FIG. 7 shows that a conductor layer 38 of an electrically conductive material is provided that defines an electrode of the load 40, and that has an electrical connection with main electrode M22. In further steps another electrode of the load may be provided, for example as part of, or electrically connected to an transparent electrically conductive layer connected to a reference source. Therewith the electric circuit as shown in FIG. 3 is obtained.

Figure 8:
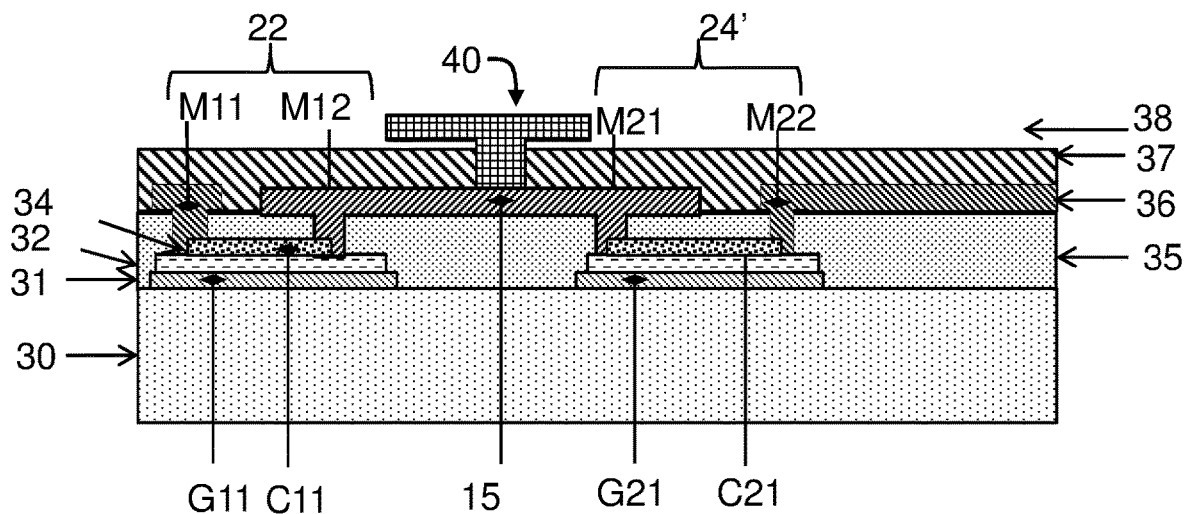
FIG. 8 is a cross-section that schematically shows an implementation of the circuit of FIG. 6.

In a similar manner an electric circuit as shown in FIG. 6 may be obtained with the above-mentioned steps as illustrated in FIG. 8. In this case the electrode of the load 40 is electrically connected to an intermediary node 15 that is provided between the first high voltage thin-film transistor 22 and the second thin-film transistor 24.

Depending on specific requirements the materials to be used may be of an organic or of an inorganic nature. Often use of organic materials may be preferred, as this allows relatively simple deposition and processing methods.

The substrate may for example be of an organic material, such as a polymer, but may alternatively be of an inorganic material, such as a glass or a metal.

Metals, e.g. Al, Au, Cu, Mo, or alloys thereof may be used as an electrically conductive material, but alternatively conducting polymers may be used for this purpose, also conducting compositions of organic and inorganic components may be used. Transparent electrically conductive structures may be provided from a material such as polyaniline, polythiophene, polypyrrole or doped polymers. Apart from organic materials, various inorganic transparent, electrically conducting materials are available like ITO (Indium Tin Oxide), IZO (Indium Zinc Oxide), ATO (Antimony Tin Oxide), or Tin Oxide can be used. Also other metal oxides are suitable for use as a transparent electrically conducting material, including but not limited to Nickel-Tungsten-Oxide, Indium doped Zinc Oxide, Magnesium-Indium-Oxide. Insulating layers may be of an inorganic material, such as a ceramic material or of a polymer.

As a semiconductor material to form the semiconducting channel in the transistors, inorganic materials like IGZO (Indium Gallium Zinc Oxide) or hydrogenated amorphous silicon (a-Si:H) may be used. Alternatively semiconducting polymer materials like P3HT, IDTBT, and N2200 are suitable.

It is noted that in the manufacturing steps described above, a layer may be provided in various manners, e.g. by printing, coating, vapor deposition, sputtering. In case a layer has to be patterned, this can be achieved by a deposition method that allows for a patterned deposition, like printing or using a masked deposition process. Alternatively, or additionally, a layer may be patterned by a patterning process e.g. by etching, mechanical removal or by ablation with a laser.

FIG. 9A shows an exemplary spatial configuration of a high voltage thin film transistor, for example the high voltage transistor 22, comprising a conductive channel C11, a first and a second main electrode M11, M12 and a gate electrode G11 below the semiconductive channel. The main electrodes M11, M12 each have an internal portion having a proper electric contact M11c, M12c (indicated as a shaded portion) with the semiconductive channel C11 at mutually opposite sides thereof. Further, the main electrodes M11, M12 each have an external portion M11e, M12e, indicated by the solid contour. As shown in FIG. 9A, the second main electrode M12 is the dominant main electrode. I.e. its external portion M12e extends further beyond its contact M12c with the semiconductive channel C11, than the external portion M11e of the subordinate electrode M11. The distance along which the external portion M12e extends is at least twice the distance, for example at least four times the distance along which the external portion M12e extends.

FIG. 9B shows an exemplary embodiment of a series arrangement of two mutually complimentary configured thin film transistors 22, 24, as used in the circuitry of FIG. 3 and as depicted in the cross-section of FIG. 7,8. Therein the configuration of transistor 22 corresponds to the one shown in FIG. 9A, and the configuration of transistor 24 is complimentary thereto. I.e. transistor comprises a conductive channel C21, a dominant main electrode M21, a subordinate main electrode M22 and a gate electrode G21 below the semiconductive channel C21.

As shown in FIG. 9B, the gate electrodes G11, G21 are mutually connected, for example in the gate electrode layer (31 see FIG. 7). The dominant main electrodes M12, M21 are formed in a common region 36C in the main electrode layer 36.

FIG. 9C shows another exemplary spatial configurations of a serial arrangement of two high voltage thin film transistors 22, 24. Elements corresponding therein to those of FIG. 9B are indicated with the same reference marks.

The invention claimed is:
1. A high voltage thin-film transistor comprising:
a gate electrode in a gate electrode layer;
a semiconductive channel in a channel layer parallel to the gate electrode layer and electrically insulated from the gate electrode by a gate dielectric layer, wherein the channel layer has a first surface facing the gate electrode layer and a second surface opposite the first surface;
a dominant main electrode and a sub-ordinate main electrode, each of the dominant main electrode and the sub-ordinate main electrode having an external portion in a main electrode layer and an internal portion that protrudes through a further dielectric layer between the main electrode layer and the channel layer to electrically contact the semiconductive channel in a dominant main electrode contact area and a subordinate main electrode contact area respectively,
wherein a first distance is defined between a side of the dominant main electrode contact area facing the subordinate main electrode contact area and a side of the external portion of the dominant main electrode facing the external portion of the subordinate main electrode,
wherein a second distance is defined between a side of the subordinate main electrode contact area facing the dominant main electrode contact area and a side of the external portion of the subordinate main electrode facing the external portion of the dominant main electrode,
wherein the first distance is at least twice as large as the second distance, and
wherein the second surface of the semiconductive channel layer faces the main electrode layer.

2. A high voltage driver circuit comprising:
a control terminal;
a first power supply terminal;
a second power supply terminal; and
a serial arrangement extending from the first power supply terminal to the second power supply terminal, the serial arrangement including:
a first high voltage thin-film transistor comprising:
a gate electrode in a gate electrode layer;
a semiconductive channel in a channel layer parallel to the gate electrode layer and electrically insulated from the gate electrode by a gate dielectric layer, wherein the channel layer has a first surface facing the gate electrode layer and a second surface opposite the first surface;
a dominant main electrode and a sub-ordinate main electrode, each of the dominant main electrode and the sub-ordinate main electrode having an external portion in a main electrode layer and an internal portion that protrudes through a further dielectric layer between the main electrode layer and the channel layer to electrically contact the semiconductive channel in a dominant main electrode contact area and a subordinate main electrode contact area respectively,
wherein a first distance is defined between a side of the dominant main electrode contact area facing the subordinate main electrode contact area and a side of the external portion of the dominant main electrode facing the external portion of the subordinate main electrode,
wherein a second distance is defined between a side of the subordinate main electrode contact area facing the dominant main electrode contact area and a side of the external portion of the subordinate main electrode facing the external portion of the dominant main electrode,
wherein the first distance is at least twice as large as the second distance, and wherein the second surface of the semiconductive channel layer faces the main electrode layer;
a second thin-film transistor; and
a load controllably powered by said serial arrangement, wherein at least one of the first high voltage thin-film transistor and the second thin-film transistor has a gate controlled by the control terminal.

3. The high voltage driver circuit according to claim 2, wherein the load is coupled between an intermediary node in the serial arrangement and a third power supply terminal,
wherein the intermediary node is provided between the first high voltage thin-film transistor and the second thin-film transistor, and
wherein the second thin-film transistor has a gate controlled by the control terminal.

4. The high voltage driver circuit according to claim 2, wherein the second thin-film transistor is a high voltage thin-film transistor comprising:
a gate electrode in a gate electrode layer;
a semiconductive channel in a channel layer parallel to the gate electrode layer and electrically insulated from the gate electrode by a gate dielectric layer, wherein the channel layer has a first surface facing the gate electrode layer and a second surface opposite the first surface;
a dominant main electrode and a sub-ordinate main electrode, each of the dominant main electrode and the sub-ordinate main electrode having an external portion in a main electrode layer and an internal portion that protrudes through a further dielectric layer between the main electrode layer and the channel layer to electrically contact the semiconductive channel in a dominant main electrode contact area and a subordinate main electrode contact area respectively,
wherein a first distance is defined between a side of the dominant main electrode contact area facing the sub-ordinate main electrode contact area and a side of the external portion of the dominant main electrode facing the external portion of the subordinate main electrode,
wherein a second distance is defined between a side of the subordinate main electrode contact area facing the dominant main electrode contact area and a side of the external portion of the subordinate main electrode facing the external portion of the dominant main electrode,
wherein the first distance is at least twice as large as the second distance, and
wherein the second surface of the semiconductive channel layer faces the main electrode layer;
wherein the second thin-film transistor includes:
a proper gate electrode;
a proper dominant main electrode; and
a proper subordinate electrode,
wherein the first and the second high voltage thin-film transistors are coupled with their gate to the control terminal,
wherein the first and the second thin-film transistors are serially connected to each other with their dominant main electrodes, and
wherein the load is arranged, in series with the serial arrangement, between the second high voltage thin-film transistor and the second power supply terminal.

5. An application comprising:
a plurality of actuators arranged in an array defined by a plurality of column lines and row lines,
wherein each actuator of the plurality of actuators is arranged as a load in a respective associated high voltage driver circuit according to claim 2, and
wherein each actuator of the plurality of actuators is associated with a respective pair of a column line of the column lines and a row line of the row lines,
wherein each respective associated high voltage driver circuit has a power supply terminal and a control terminal electrically connected with the column line and the row line of an associated respective pair, respectively.

6. The application according to claim 5, wherein the actuators are polymer membrane actuators.

7. A display comprising a plurality of display elements arranged in an array defined by a plurality of column lines and row lines,
wherein each display element is arranged as a load in a respective associated circuit according to claim 2, and
wherein each display element is associated with a respective pair of a column line of the column lines and a row line of the row lines,
wherein the respective associated high voltage driver circuit has a power supply terminal and a control terminal electrically connected with the column line and the row line of an associated respective pair, respectively.

8. The display according to claim 7, wherein the display elements are electro-phoretic elements.

9. The display according to claim 7, wherein the display elements are piezoelectric elements.

10. An imager comprising a plurality of image sensor elements arranged in an array defined by a plurality of column lines and row lines,
wherein each image sensor element is arranged as a load in a respective associated circuit according to claim 2 and
wherein each image sensor is associated with a respective pair of a column line of the column lines and a row line of the row lines,
wherein the respective associated high voltage driver circuit has a power supply terminal and a control terminal electrically connected with the column line and the row line of an associated respective pair, respectively.

11. An imager according to claim 10, wherein the image sensor elements are ultrasound transducers.

12. A method of manufacturing a high voltage thin-film transistor comprising:
providing a substrate,
providing a gate electrode layer of an electrically conductive material defining a gate electrode,
providing a gate dielectric layer of a dielectric material, defining a gate dielectric for the gate electrode,
providing a channel layer of a semiconductive material defining a semiconductive channel, the channel layer having a first surface facing the gate electrode layer and a second surface opposite the first surface,
providing a further dielectric layer of a dielectric material,
providing an internal portion of a dominant main electrode that protrudes through the further dielectric layer to electrically contact the semiconductive channel in a dominant main electrode contact area,
providing an internal portion of a subordinate main electrode that protrudes through the further dielectric layer to electrically contact the semiconductive channel in a subordinate main electrode contact area providing a main electrode layer of an electrically conductive material comprising an external portion of the dominant main electrode and an external portion of the subordinate main electrode, wherein the external portion of the dominant main electrode and the external portion of the subordinate main electrode are mutually distinct, wherein a first distance is defined between a side of the dominant main electrode contact area facing the subordinate main electrode contact area and a side of the external portion of the dominant main electrode facing the external portion of the subordinate main electrode, wherein a second distance is defined between a side of the subordinate main electrode contact area facing the dominant main electrode contact area and a side of the external portion of the subordinate main electrode facing the external portion of the dominant main electrode, wherein the first distance is at least twice as large as the second distance, and wherein the second surface of the channel layer faces the main electrode layer.

13. A method of manufacturing a high voltage driver circuit comprising manufacturing a high voltage thin-film transistor according to claim 12, wherein:

the gate electrode layer defines a further gate electrode;

the gate dielectric layer additionally defines a gate dielectric for the further gate electrode;

the channel layer additionally defines a further semiconductive channel;

the main electrode layer additionally comprises:

an external portion of a further dominant main electrode, and an external portion of a further subordinate main electrode, wherein the external of the further dominant main electrode and the external portion of the further subordinate main electrode are mutually distinct, wherein the further dominant main electrode has an internal portion that protrudes through the further dielectric layer to electrically contact the further semiconductive channel in a further dominant main electrode contact area, wherein the further subordinate main electrode has an internal portion that protrudes through the further dielectric layer to electrically contact the further semiconductive channel in a further subordinate main electrode contact area, wherein a first further distance is defined between a side of the further dominant main electrode contact area facing the further subordinate main electrode contact area and a side of the external portion of the further dominant main electrode facing the external portion of the further subordinate main electrode, wherein a second further distance is defined between a side of the further subordinate main electrode contact area facing the further dominant main electrode contact area and a side of the external portion of the further subordinate main electrode facing the external portion of the further dominant main electrode, and wherein the first further distance is at least twice as large as the second further distance.

14. The method of manufacturing a high voltage driver circuit according to claim 13, wherein the external portion of the dominant main electrode and the external portion of the further dominant main electrode are formed by a common region in the main electrode layer.

15. A method of manufacturing an application comprising the method of manufacturing a high voltage driver according to claim 14, and further comprising:

providing an insulating layer of an electrically insulating material;

providing a conductive layer of an electrically conductive material defining an electrode of a load, and having an electrical connection with an external portion of the subordinate main electrode or the further subordinate main electrode.

* * * * *